United States Patent
Sirman et al.

(10) Patent No.: US 10,431,500 B1
(45) Date of Patent: Oct. 1, 2019

(54) MULTI-STEP INSULATOR FORMATION IN TRENCHES TO AVOID SEAMS IN INSULATORS

(71) Applicant: GLOBALFOUNDRIES INC., Grand Cayman (KY)

(72) Inventors: Asli Sirman, Malta, NY (US); Jiehui Shu, Clifton Park, NY (US); Chih-Chiang Chang, Clifton Park, NY (US); Huy Cao, Rexford, NY (US); Haigou Huang, Rexford, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/936,734

(22) Filed: Mar. 27, 2018

(51) Int. Cl.
| | |
|---|---|
| H01L 21/00 | (2006.01) |
| H01L 21/8234 | (2006.01) |
| H01L 29/66 | (2006.01) |
| H01L 21/762 | (2006.01) |
| H01L 27/088 | (2006.01) |
| H01L 29/78 | (2006.01) |

(52) U.S. Cl.
CPC ......... H01L 21/823481 (2013.01); H01L 21/76224 (2013.01); H01L 21/823431 (2013.01); H01L 27/0886 (2013.01); H01L 29/66545 (2013.01); H01L 29/785 (2013.01)

(58) Field of Classification Search
CPC ............... H01L 29/785; H01L 29/66545
See application file for complete search history.

(56) References Cited

U.S. PATENT DOCUMENTS

| | | | | |
|---|---|---|---|---|
| 8,890,262 | B2* | 11/2014 | Kamineni | H01L 29/401 257/330 |
| 9,105,497 | B2 | 8/2015 | Hong et al. | |
| 9,240,483 | B2 | 1/2016 | Lee et al. | |
| 9,362,181 | B1* | 6/2016 | Xie | H01L 21/823878 |
| 9,496,225 | B1* | 11/2016 | Adusumilli | H01L 23/535 |
| 9,514,983 | B2 | 12/2016 | Jezewski et al. | |
| 9,842,931 | B1 | 12/2017 | Anderson et al. | |
| 9,859,157 | B1* | 1/2018 | Murray | H01L 21/76864 |
| 10,115,825 | B1* | 10/2018 | Liaw | H01L 29/7848 |
| 2004/0211357 | A1 | 10/2004 | Gadgil et al. | |
| 2013/0299922 | A1* | 11/2013 | Choi | H01L 21/82345 257/412 |
| 2015/0255324 | A1 | 9/2015 | Li et al. | |
| 2016/0163585 | A1* | 6/2016 | Xie | H01L 21/76843 257/368 |
| 2016/0163604 | A1* | 6/2016 | Xie | H01L 21/823878 257/401 |

(Continued)

Primary Examiner — Nicholas J Tobergte
(74) Attorney, Agent, or Firm — Gibb & Riley, LLC; Francois Pagette

(57) ABSTRACT

Methods produce integrated circuit structures that include (among other components) fins extending from a first layer, source/drain structures on the fins, source/drain contacts on the source/drain structures, an insulator on the source/drain contacts defining trenches between the source/drain contacts, gate conductors in a lower portion of the trenches adjacent the fins, a first liner material lining a middle portion and an upper portion of the trenches, a fill material in the middle portion of the trenches, and a second material in the upper portion of the trenches. The first liner material is on the gate conductors in the trenches.

19 Claims, 10 Drawing Sheets

(56) References Cited

U.S. PATENT DOCUMENTS

| | | |
|---|---|---|
| 2017/0032972 A1 | 2/2017 | Tsai et al. |
| 2017/0125530 A1* | 5/2017 | Zhang ............... H01L 29/41791 |
| 2017/0352597 A1* | 12/2017 | Adusumilli ........... H01L 23/485 |
| 2018/0166319 A1* | 6/2018 | Park .................... H01L 21/7682 |
| 2018/0211875 A1* | 7/2018 | Basker .............. H01L 21/76897 |
| 2018/0212040 A1* | 7/2018 | Bao .................... H01L 29/7827 |
| 2018/0218947 A1* | 8/2018 | Xie ................. H01L 21/823431 |
| 2018/0240889 A1* | 8/2018 | Chi .................... H01L 29/6656 |

\* cited by examiner

MULTI-STEP INSULATOR FORMATION IN TRENCHES TO AVOID SEAMS IN INSULATORS

BACKGROUND

Field of the Invention

The present disclosure relates to the formation of transistor structures, and more specifically to forming transistors on fin structures using a multi-step insulator formation process for the insulators in trenches above the gates, to avoid forming undesirable seams or gaps in the insulators.

Description of Related Art

Integrated circuit devices use transistors for many different functions, and these transistors can take many different forms, from planar transistors, to transistors that use a "fin" style structure. A fin of a fin-type transistor is a thin, long, six-sided rectangle that extends from a substrate, with sides that are longer than they are wide, a top and bottom that have the same length as the sides (but that have a width that is much more narrow), and ends that are as tall from the substrate as the width of the sides, but that are only as wide as the as the top and bottom.

As transistors are made smaller, it can be difficult to avoid irregularities such as seams in insulators. Such seams in insulators can lead to defective devices that result in short circuits or unexpected increases in resistance; and this can reduce yield and/or device performance.

SUMMARY

Various methods herein include steps such as patterning a semiconductor layer to form fins that extend from the semiconductor layer, forming sacrificial gates on such fins, and forming an insulator on the sacrificial gates. Also, these methods epitaxially grow source/drain structures on the fins between the sacrificial gates and deposit a first conductor to form source/drain contacts on the source/drain structures between the sacrificial gates. Further, these methods perform a selective material removal process that removes the sacrificial gates, without affecting other structures, and this leaves trenches between the source/drain contacts. Additionally, the methods herein deposit a second conductor to form gate conductors in a lower portion of the trenches.

Such methods perform a first atomic layer deposition (ALD) process to deposit/line a first liner material on the source/drain contacts and in the trenches, so that the first liner material covers (contacts) the gate conductors, and lines a middle portion and an upper portion of the trenches. The first liner material can be, for example, silicon combined with at least one of nitrogen, oxygen, and carbon (e.g., SiOC, SiN, etc.).

These methods continue by flowing a fill material on the first liner material and this fills the middle portion and the upper portion of the trenches. The fill material is an insulator (e.g., having a dielectric constant lower than 3.0), such as a flowable combination of silicon, oxygen, and carbon (e.g., SiOC, etc.). Subsequently, this processing removes the fill material from areas over the source/drain contacts (e.g., by chemical mechanical polishing (CMP), etc.) and from the upper portion of the trenches (e.g., by reactive ion etching (RIE), etc.), to leave the fill material only in the middle portion of the trenches. These methods also perform a second ALD of a second material to fill the upper portion of the trenches with the second material. For example, the second material can be a combination of silicon and nitrogen (e.g., SiN, etc.).

The first ALD and the second ALD deposit the first liner material and the second material over the source/drain contacts. Therefore, these methods also perform a planarization process to remove the first liner material and the second material from the source/drain contacts.

Such methods produce various integrated circuit structures, and such structures include (among other components) fins extending from a first layer, source/drain structures on the fins, source/drain contacts on the source/drain structures, an insulator on the source/drain contacts defining trenches between the source/drain contacts, gate conductors in a lower portion of the trenches adjacent the fins, a first liner material lining a middle portion and an upper portion of the trenches, a fill material in the middle portion of the trenches, and a second material in the upper portion of the trenches. The first liner material is on the gate conductors in the trenches.

The first liner material can be silicon combined with at least one of nitrogen, oxygen, and carbon (e.g., SiOC, SiN, etc.). The fill material can be an insulator (e.g., having a dielectric constant below 3.0) that is a flowable combination of silicon, oxygen, and carbon (e.g., SiOC, etc.). The second material can be a combination of silicon and nitrogen (e.g., SiN, etc.).

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, as transistors are made smaller, it can be difficult to avoid irregularities such as seams or gaps in insulators. For example, one advance that allows transistor devices to be made smaller is atomic layer deposition (ALD), which can potentially form layers as thin as a single atom of material. ALD is a conformal/precise deposition technique and is used for gap fill applications. However, ALD can sometimes form a seam at the center of the fill for high aspect ratio structures, and this creates a weak point for downstream cleans/etches, which can eventually lead to defects. For example, in a self-aligned contact (SAC) capping process, a spatial ALD SiN material is deposited to fill a trench having an aspect ratio of 3:1. However, if a seam is formed in the trench, this can produce variability and problems with reliability.

The systems and methods herein address these issues by using a multi-step insulator formation process for the insulators in the trenches above the gates, to avoid forming seams in the insulators. Thus, the processing herein forms a trench in a base layer over a semiconductor substrate, and deposits, for example, a conformal 2-3 nm thick liner by ALD to improve the adhesion. The liner material is selected to be selective to the fill material in a subsequent material removal process. This processing then fills the remainder of the trench with a dielectric (k<2.9) by flowable deposition, recesses a portion of the dielectric, and fills the recess with a second dielectric (by ALD), followed by polishing. This dramatically reduces the aspect ratio of the trench during the final ALD process in the upper portion of the trench, which thereby produces a seam free fill for SAC cap applications.

FIGS. 1A-12 schematically illustrate processing herein. More specifically, FIGS. 1A, 2A, 3A, and 4A are top view (plan view) schematic illustrations, and corresponding FIGS. 1B, 2B, 3B, 4B, and 5-12 are cross-sectional view schematic illustrations along line X-X in FIGS. 1A, 2A, 3A, and 4A.

Figure 1A:
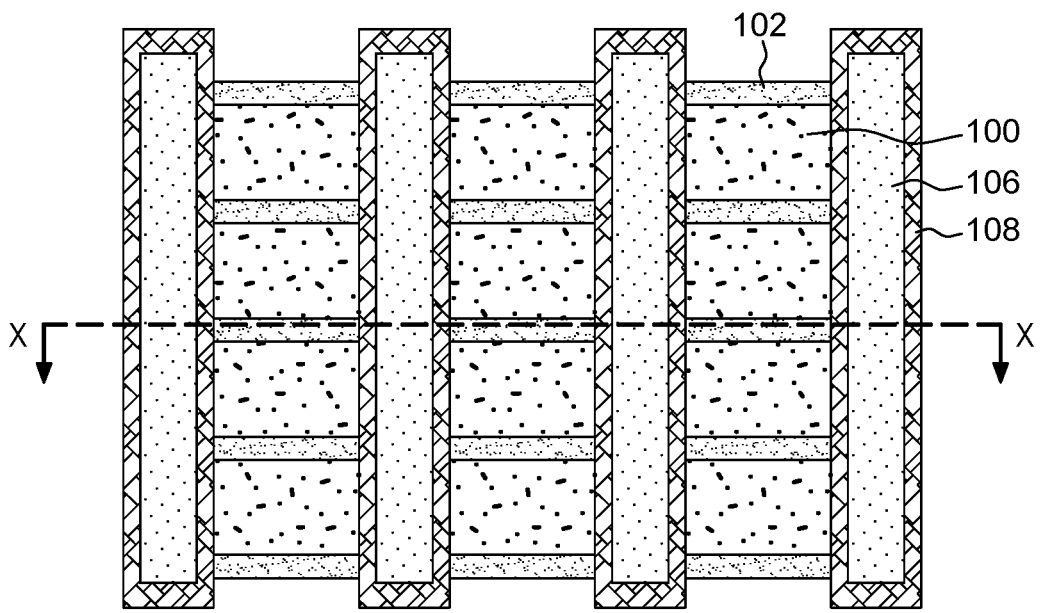
FIG. 1A is a top view schematic diagram illustrating structures according to embodiments herein.
Figure 1B:
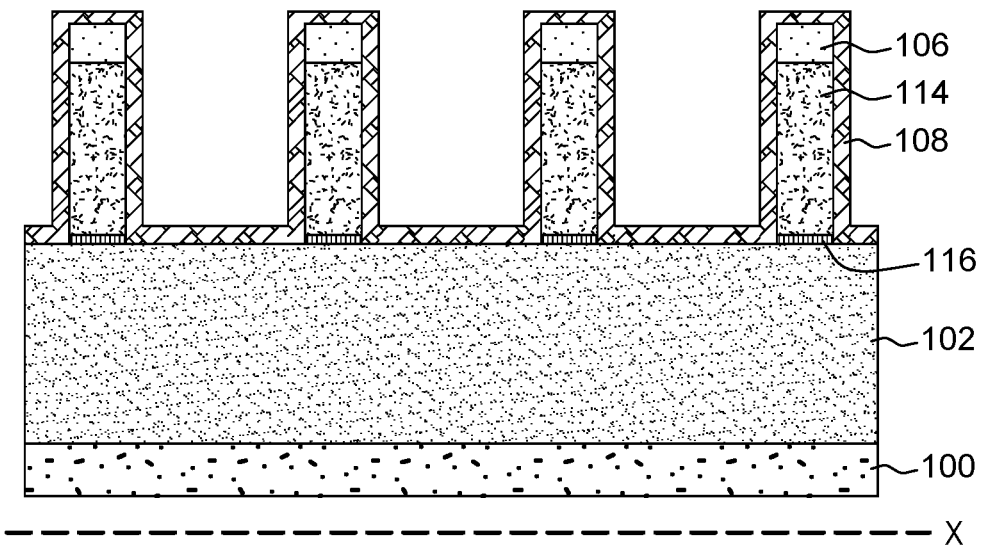
FIG. 1B is a side view schematic diagram, along line X-X in FIG. 1A, illustrating structures according to embodiments herein.

Therefore, as shown in FIGS. 1A-1B, methods herein include steps such as patterning a semiconductor layer to form fins 102 that extend from an underlying semiconductor layer 100. The underlying semiconductor layer 100 (and fins) can be a material implanted with an impurity, or a material formed with sufficient impurity to form a semiconductor. Note that in FIGS. 1A and 2A, the layer 100 from which the fins 102 are patterned is shown using a different color from the fins 102 even though the two are the same material, in order to differentiate the two. Further, the insulator 108 is only partially shown in FIGS. 1A and 2A, again to allow the layer 100 and fins 102 to be more easily seen.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then, one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

As also shown in FIGS. 1A-1B, methods herein form/grow gate insulators 116 on the fins 102 (or the gate insulators 116 can be formed later in the processing), and form sacrificial gates 114 on such fins 102, with gate caps 106 over the sacrificial gates 114. The sacrificial gates 114 can be any appropriate material that can be selectively removed, while leaving other materials, and therefore, the material makeup of the sacrificial gates 114 and caps 106 will depend upon the other materials used in the structure. In some examples, the sacrificial gates 114 can be polysilicon, and the caps 106 can be silicon nitride, etc.

As further shown in FIGS. 1A-1B, methods herein form/grow an insulator 108 on the sacrificial gates 114 (e.g., insulating spacers). For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Figure 2A:
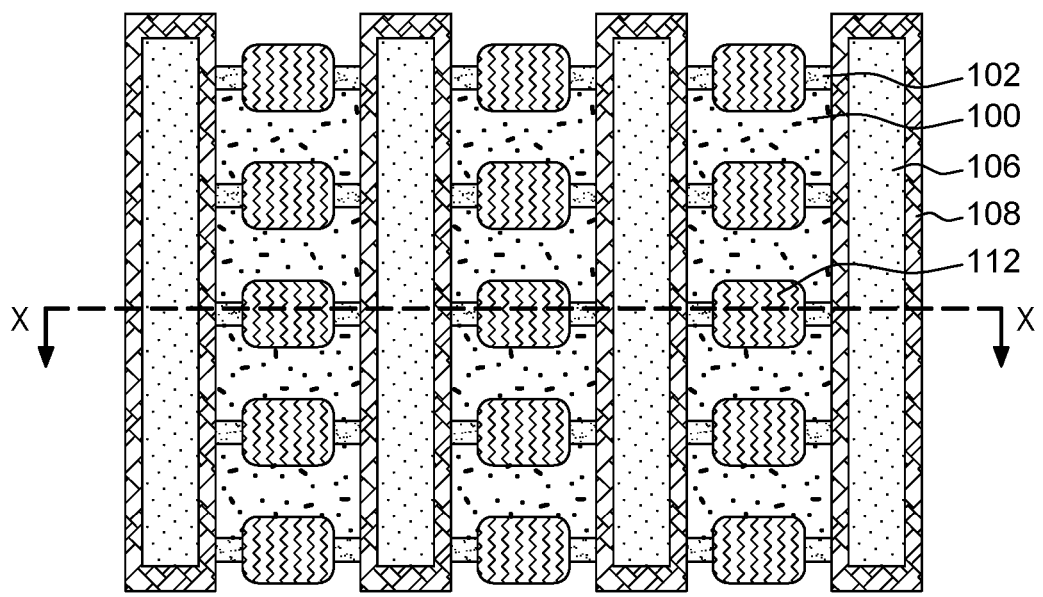
FIG. 2A is a top view schematic diagram illustrating structures according to embodiments herein.
Figure 2B:
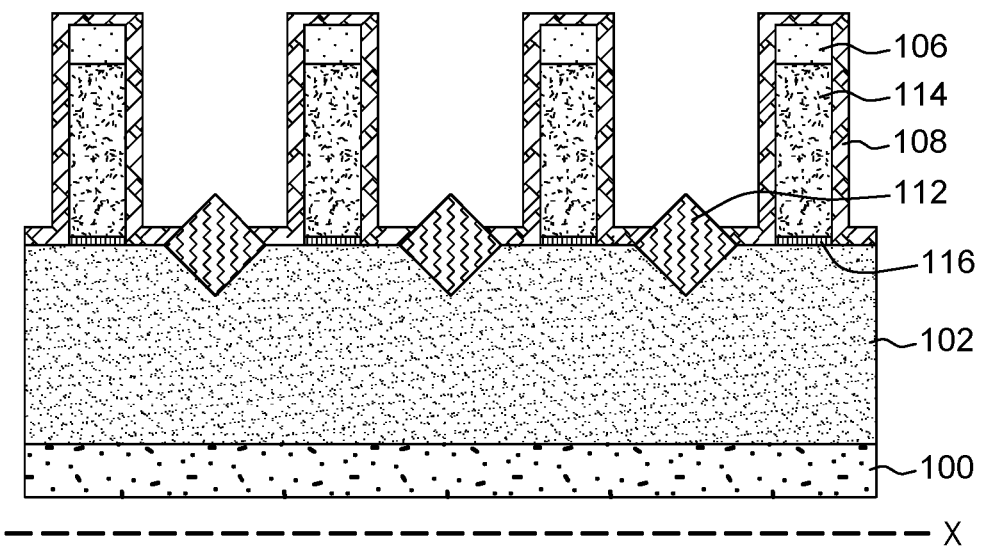
FIG. 2B is a side view schematic diagram, along line X-X in FIG. 1A, illustrating structures according to embodiments herein.

FIGS. 2A-2B illustrate that these methods epitaxially grow source/drain structures 112 on the fins 102 between the sacrificial gates 114. The source/drain structures 112 can be conductors grown on/from the fins 102 in processes that increase the conductivity of the source/drain structures 112 by increasing doping concentrations.

Figure 3A:
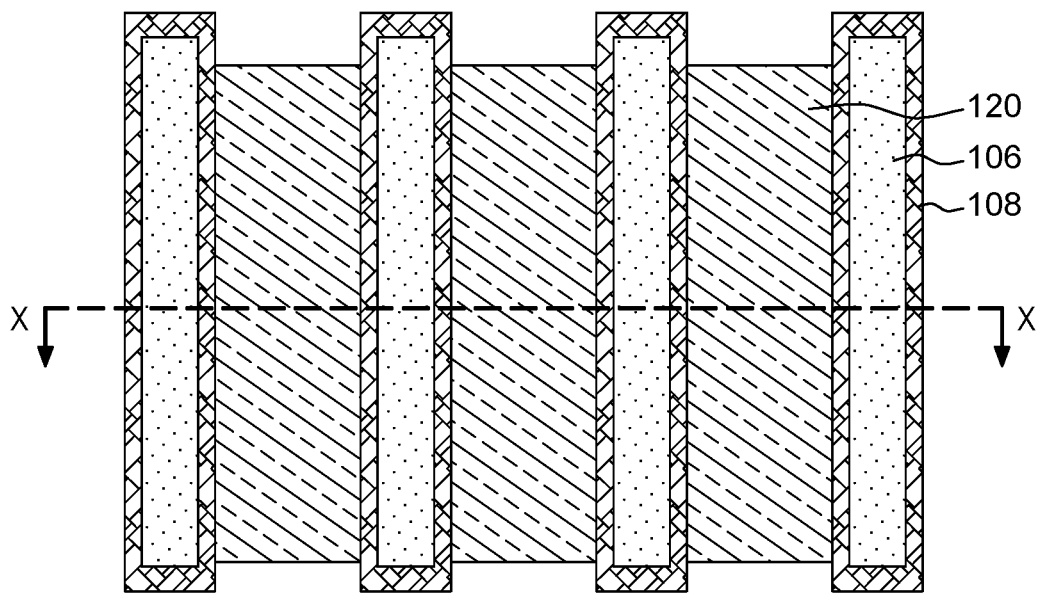
FIG. 3A is a top view schematic diagram illustrating structures according to embodiments herein.
Figure 3B:
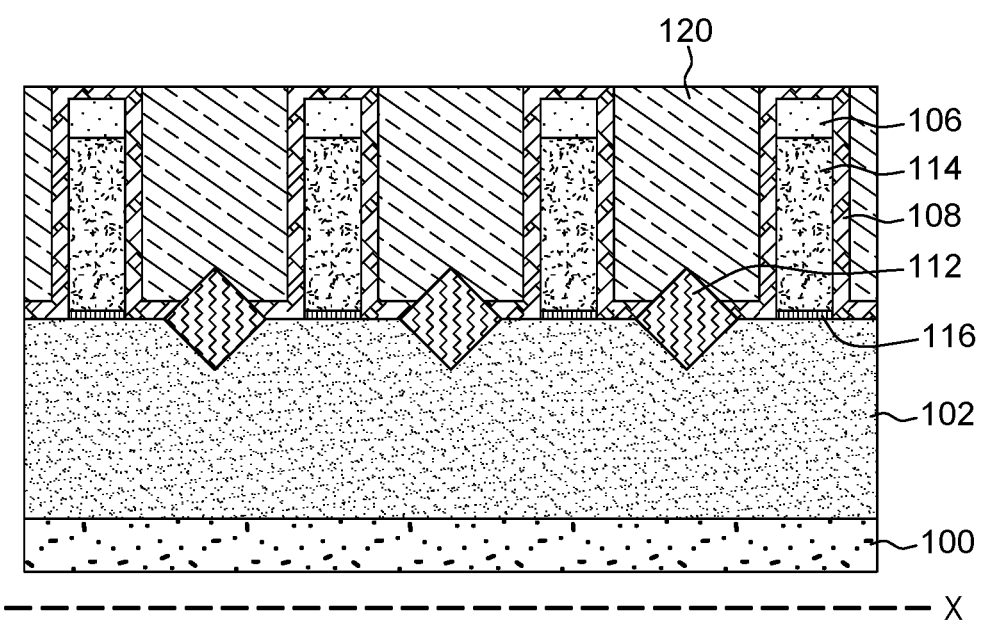
FIG. 3B is a side view schematic diagram, along line X-X in FIG. 1A, illustrating structures according to embodiments herein.

FIGS. 3A-3B illustrate that processing herein deposits a first conductor to form source/drain contacts 120 on the source/drain structures 112 between the sacrificial gates 114. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Figure 4A:
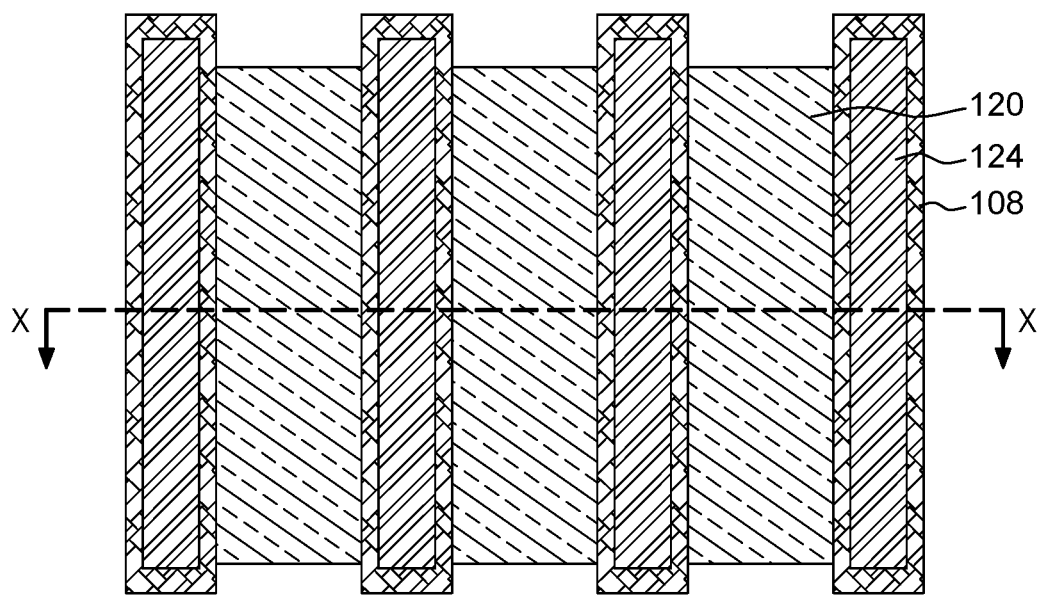
FIG. 4A is a top view schematic diagram illustrating structures according to embodiments herein.
Figure 4B:
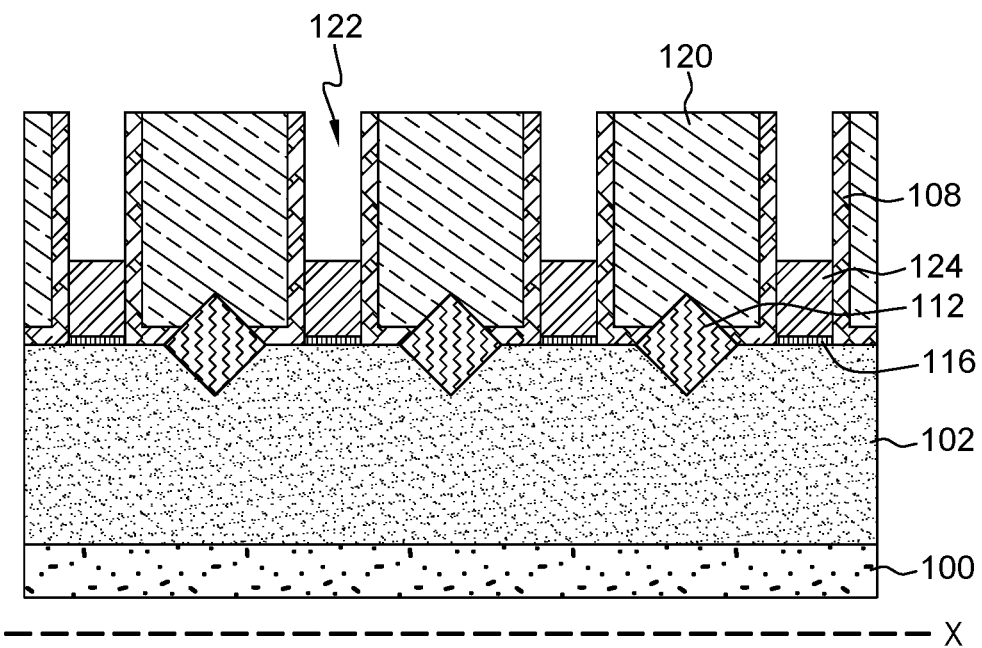
FIG. 4B is a side view schematic diagram, along line X-X in FIG. 1A, illustrating structures according to embodiments herein.

Further, as shown in FIGS. 4A-4B, these methods perform a selective material removal process that removes the sacrificial gates 114, without affecting other structures 112, and this leaves trenches 122 between the source/drain contacts 120. Selective material removal processing applies materials that dissolve or destroy selected materials, while not substantially affecting other materials. In one example, one or more sequential processing steps can apply a material that only attacks the caps 106, followed by application of a different material that only attacks the sacrificial gates 114, to leave trenches 122.

Additionally, the methods herein deposit a second conductor to form gate conductors 124 in a lower portion of the trenches 122. The gate conductors 124 can be the same material as, or a different material from, the source/drain contacts 120, depending upon specific design criteria for the integrated circuit device. Prior to forming the gate conductors 124, the gate insulators 116 can be formed/grown on the fins 102 at the bottom of the trenches 122, if not formed earlier.

Figure 5:
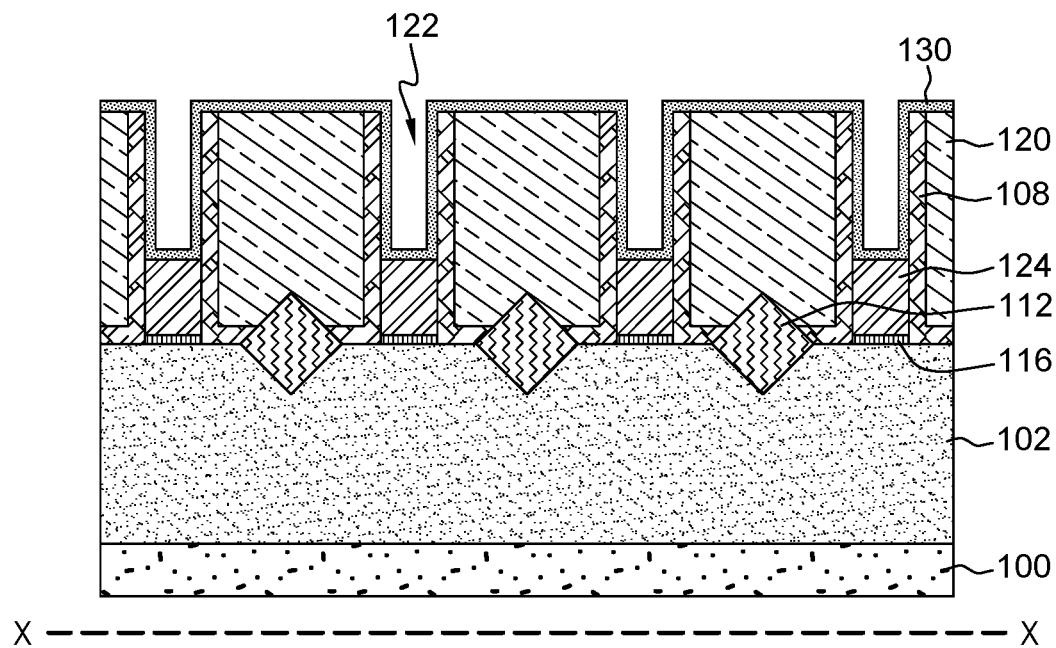
FIGS. 5-13 are side view schematic diagrams, along line X-X in FIGS. 1A, 2A, 3A, and 4A, illustrating structures according to embodiments herein.

Note that FIGS. 5-12 do not include the top view shown in FIGS. 1A, 2A, 3A, and 4A because such views in FIGS. 5-12 would only show one material and, therefore, only side views are shown. As shown in FIG. 5, these methods perform a first atomic layer deposition (ALD) process to deposit/line a first liner material 130 on the source/drain contacts 120 and in the trenches 122, so that the first liner material 130 covers (contacts 120) the gate conductors 124, and lines a middle portion and an upper portion of the trenches 122. The first liner material 130 can be, for example, silicon combined with at least one of nitrogen, oxygen, and/or carbon (e.g., SiOC, SiN, etc.).

Figure 6:
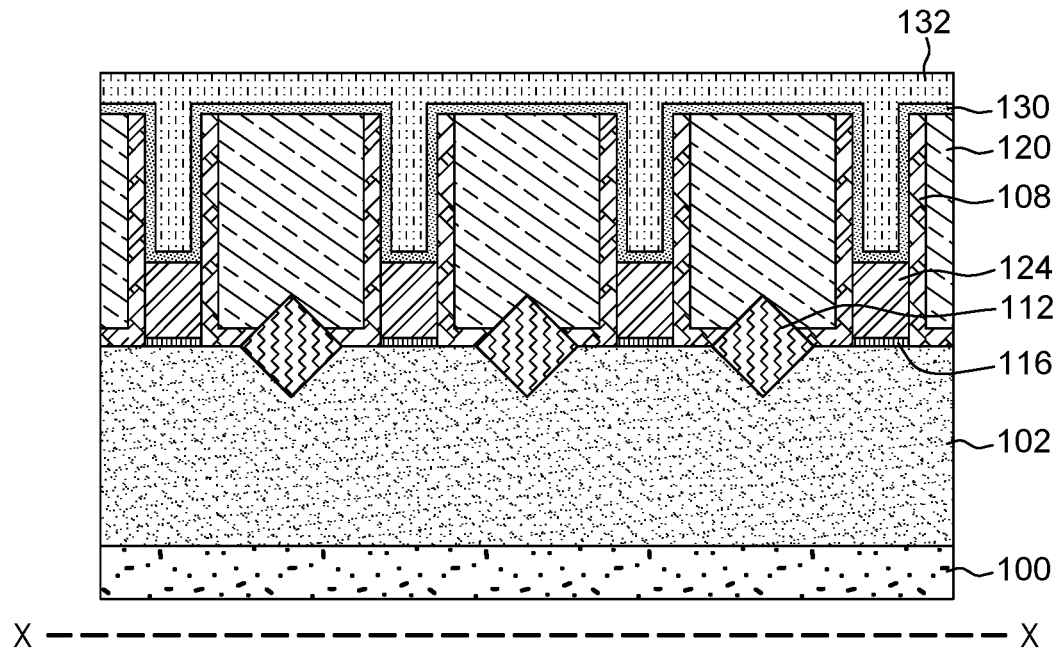

As shown in FIG. 6, these methods continue by flowing a fill material 132 on the first liner material 130 and this fills the middle portion and the upper portion of the trenches 122. The fill material 132 is an insulator 108 (e.g., for example can have a dielectric constant lower than 3.0), such as a flowable combination of silicon, oxygen, and carbon (e.g., SiOC, etc.).

Figure 7:
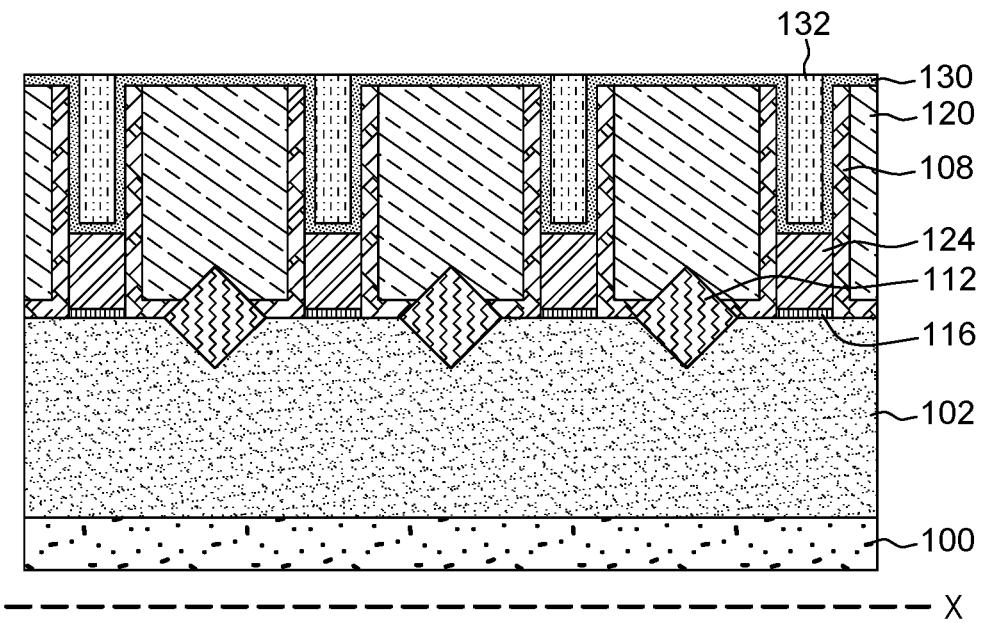
Figure 8:
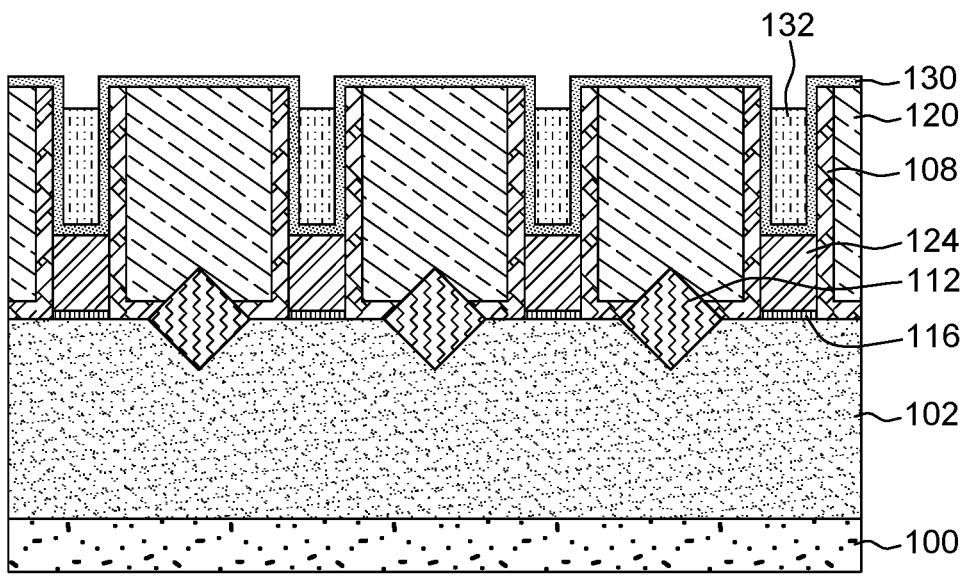

Subsequently, as shown in FIG. 7, this processing removes the fill material 132 from areas over the source/drain contacts 120 using planarization processing, such as chemical mechanical polishing (CMP) processing, which is stopped when the first liner material 130 is reached. As shown in FIG. 8, these methods also remove the fill material 132 from the upper portion of the trenches 122 (e.g., by reactive ion etching (RIE), etc.), to leave the fill material 132 only in the middle portion of the trenches 122. In other alternatives, rather than performing CMP processing in FIG. 7, an ash and material removal process using hydrofluoric acid can be used to recess the fill material 132 is a single step, avoiding the RIE processing of FIG. 8.

Figure 9:
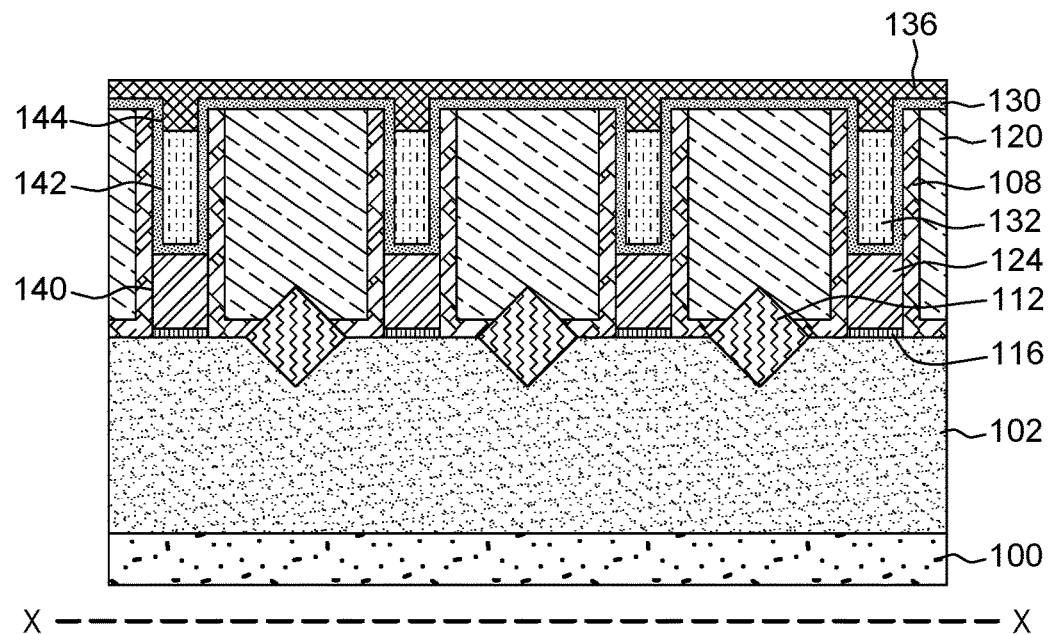

As shown in FIG. 9, these methods also perform a second ALD of a second material 136 to fill the upper portion of the trenches 122 with the second material 136. For example, the second material 136 can be a combination of silicon and nitrogen (e.g., SiN, etc.). A feature of this processing is that the aspect ratio of the upper portion of the trenches 122 (the portion above the fill material 132) has a very low aspect ratio, which avoids seam formation. Again, ALD seam formation results (at least in part) from high aspect ratios, and by decreasing the trench aspect ratio, this processing avoids ALD seam formation in the upper portion of the trenches 122.

For convenience, and as shown only in FIG. 9 to avoid clutter in the drawings, as used herein, the arbitrary term "lower" portion 140 of the trenches 122 is that portion adjacent (closest to) the fins 102 (e.g., the bottom 20-40% of the trenches); and similarly, the arbitrary terms "middle" and "upper" have the relationship where the middle portion 142 (e.g., the middle 35-65%) of the trenches 122 is between the lower portion 140 and the upper portion 144 (e.g., the top 10-25%) of the trenches 122.

Figure 10:
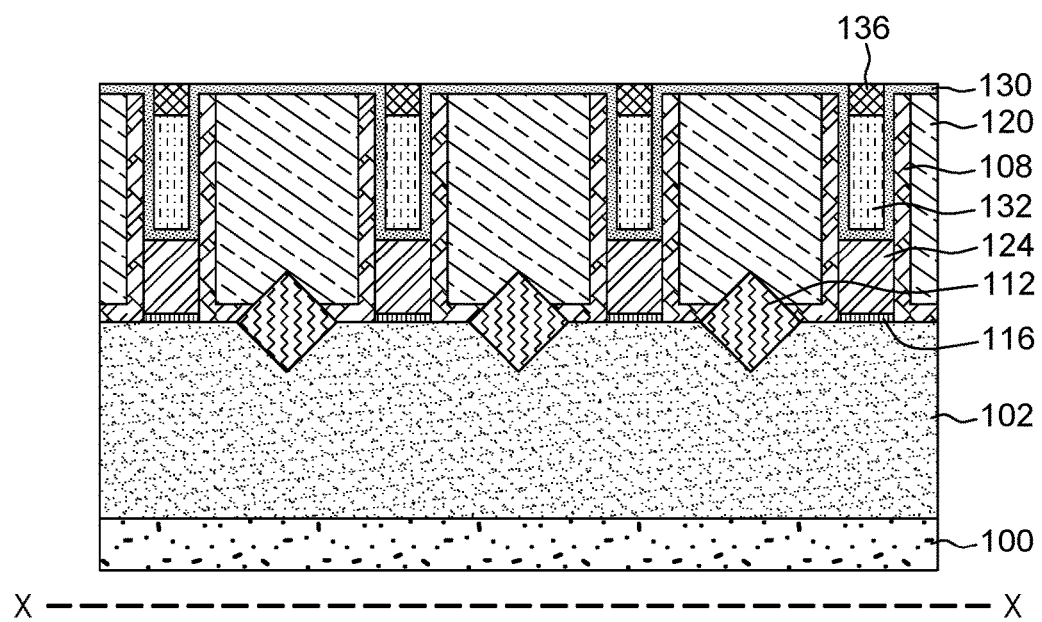
Figure 11:
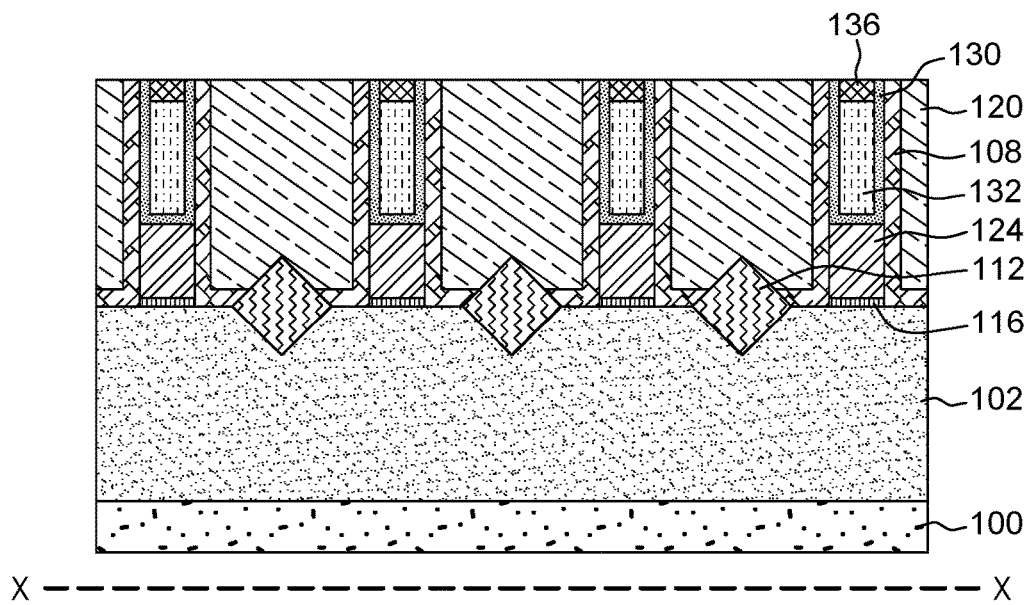

As shown in FIG. 10, the first ALD and the second ALD can deposit and leave the first liner material 130 and the second material 136 over the source/drain contacts 120. Therefore, as shown in FIG. 11, these methods also perform a planarization process (e.g., CMP) to remove the first liner material 130 and the second material 136 from the source/drain contacts 120.

Figure 12:
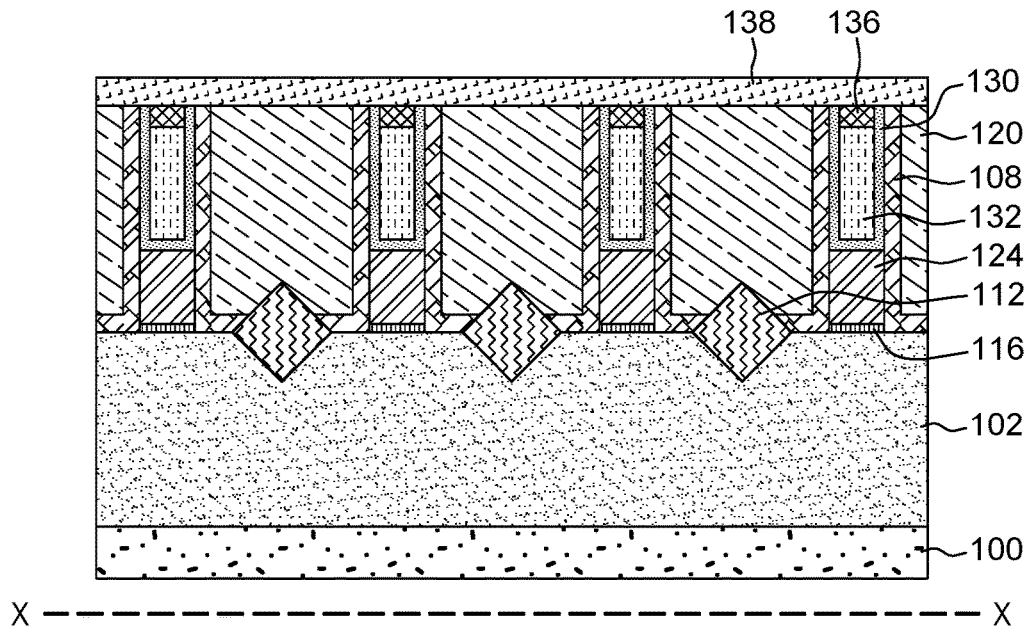

As shown in FIG. 12, additional layers such as a cap 138 formed of an insulator (e.g., SiCN, etc.) can be formed to add to the structures herein. Thus, as shown in FIG. 12, such methods produce various final complete integrated circuit structures, and such structures include (among other components) fins 102 extending from a first layer 100, source/drain structures 112 on the fins 102 (the fin 102 portions between the source/drain structures 112 form channel regions of the transistors). These structures further include source/drain contacts 120 on the source/drain structures 112, an insulator 108 on the source/drain contacts 120 defining trenches 122 between the source/drain contacts 120, and gate conductors 124 in a lower portion of the trenches 122 adjacent the fins 102. The unique processing herein forms a first liner material 130 lining a middle portion 142 and an upper portion 144 of the trenches 122, a fill material 132 in the middle portion 142 of the trenches 122, and a second material 136 in the upper portion 144 of the trenches 122. The first liner material 130 is on the gate conductors 124 in the trenches 122. In some examples, the first liner material 130 can be silicon combined with at least one of nitrogen, oxygen, and carbon (e.g., SiOC, SiN, etc.). The fill material 132 can be an insulator 108 (e.g., having a dielectric constant below 3.0) that is a flowable combination of silicon, oxygen, and carbon (e.g., SiOC, etc.). The second material 136 can be a combination of silicon and nitrogen (e.g., SiN, etc.).

Figure 13:
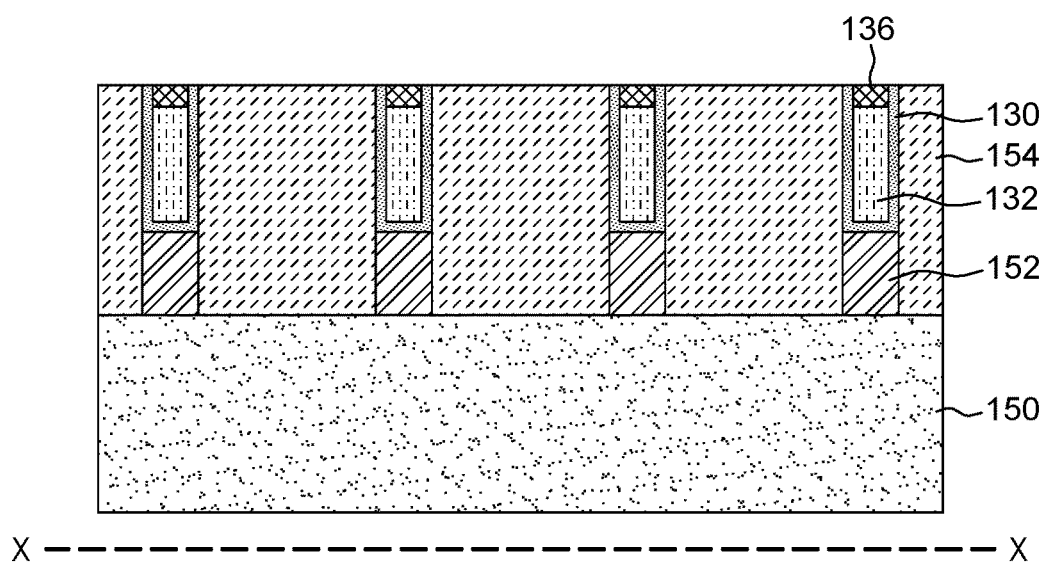

While the processing herein has been discussed, above, with respect to a specific transistor structure, it is applicable to all processing that forms insulators in trenches above any form of conductor. Therefore, FIG. 13 illustrates the same view as FIGS. 5-12; however, of a structure that includes any form of substrate 150, any form of conductors 152, within a trench of a layer of material 154. The remaining numbered items in FIG. 13 are the same as those discussed above and are formed in the same processing. Therefore, FIG. 13 also illustrates the first liner material 130, the fill material 132, and the second material 136 formed as discussed above.

Figure 14:
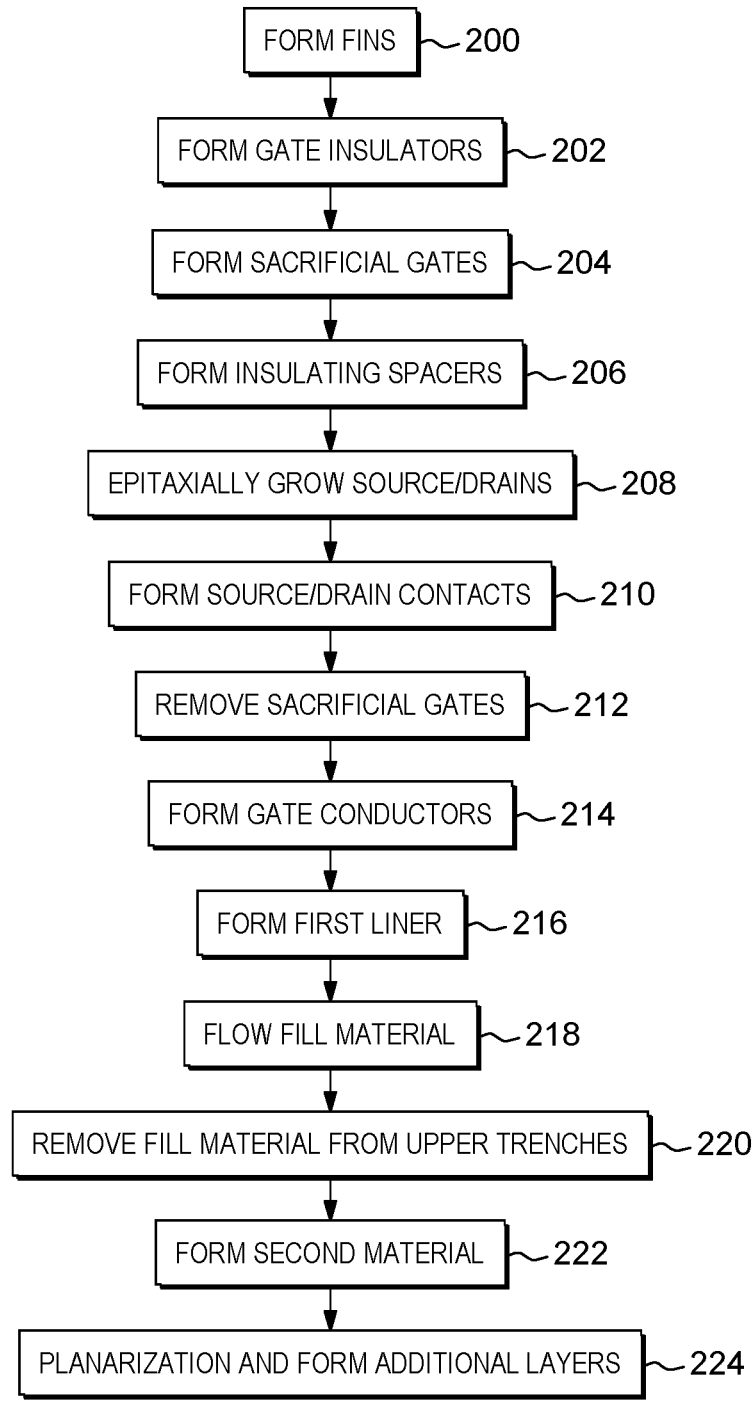
FIG. 14 is a flow diagram illustrating embodiments herein.

FIG. 14 is a flowchart illustrating the foregoing processing. More specifically, FIG. 14 illustrates that methods herein include steps of 200 patterning a semiconductor layer to form fins that extend from the semiconductor layer, forming gate insulators 202 on the fins, forming sacrificial gates 204 on such fins, and forming insulating spacers on the sacrificial gates 206. Also, these methods epitaxially grow source/drain structures on the fins between the sacrificial gates 208, and deposit a first conductor to form source/drain contacts 210 on the source/drain structures between the sacrificial gates. Further, these methods perform a selective material removal process that removes the sacrificial gates 212, without affecting other structures, and this leaves trenches between the source/drain contacts. Additionally, the methods herein deposit a second conductor to form gate conductors 214 in a lower portion of the trenches.

In item 216, such methods perform a first atomic layer deposition (ALD) process to deposit/line a first liner material on the source/drain contacts and in the trenches, so that the first liner material covers (contacts) the gate conductors, and lines a middle portion and an upper portion of the trenches. The first liner material can be, for example, silicon combined with at least one of nitrogen, oxygen, and carbon (e.g., SiOC, SiN, etc.).

These methods continue by flowing a fill material 218 on the first liner material and this fills the middle portion and the upper portion of the trenches. The fill material is an insulator (e.g., having a dielectric constant lower than 3.0), such as a flowable combination of silicon, oxygen, and carbon (e.g., SiOC, etc.). Subsequently, this processing removes the fill material from areas over the source/drain contacts (e.g., by chemical mechanical polishing (CMP), etc.) and from the upper portion of the trenches 220 (e.g., by reactive ion etching (RIE), etc.), to leave the fill material only in the middle portion of the trenches. These methods also perform a second ALD of a second material to fill the upper portion of the trenches with the second material 222. For example, the second material can be a combination of silicon and nitrogen (e.g., SiN, etc.).

The first ALD and the second ALD deposit the first liner material and the second material over the source/drain contacts. Therefore, these methods also perform a planarization process to remove the first liner material and the second material from the source/drain contacts, and form additional layers on the structure 224.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

A hardmask can be formed of any suitable material, whether now known or developed in the future, such as a nitride, metal, or organic hardmask, that has a hardness greater than the substrate and insulator materials used in the remainder of the structure.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
   forming a trench in a material;
   forming a conductor in a lower portion of the trench;
   performing a first atomic layer deposition (ALD) of a first liner material to line a middle portion and an upper portion of the trench, the middle portion is between the lower portion and the upper portion;
   flowing a fill material comprising an insulator to fill the middle portion and the upper portion of the trench;
   removing the fill material from the upper portion of the trench to leave the fill material in the middle portion of the trench; and
   performing a second ALD of a second material to fill the upper portion of the trench with the second material.

2. The method according to claim 1, wherein the first liner material is formed on the conductor.

3. The method according to claim 1, wherein the first liner material comprises silicon combined with at least one of nitrogen, oxygen, and carbon.

4. The method according to claim 1, wherein the fill material comprises a flowable combination of silicon, oxygen, and carbon.

5. The method according to claim 1, wherein the second material comprises a combination of silicon and nitrogen.

6. The method according to claim 1, wherein the removing the fill material from the upper portion of the trench comprises reactive ion etching (ME).

7. A method comprising:
   forming fins extending from a first layer;
   forming sacrificial gates on the fins;
   forming source/drain structures on the fins between the sacrificial gates;
   forming source/drain contacts on the source/drain structures between the sacrificial gates;
   removing the sacrificial gates to leave trenches between the source/drain contacts;
   forming gate conductors in a lower portion of the trenches adjacent the fins;
   performing a first atomic layer deposition (ALD) of a first liner material to line a middle portion and an upper portion of the trenches, the middle portion is between the lower portion and the upper portion;
   flowing a fill material to fill the middle portion and the upper portion of the trenches;
   removing the fill material from the upper portion of the trenches to leave the fill material in the middle portion of the trenches; and
   performing a second ALD of a second material to fill the upper portion of the trenches with the second material.

8. The method according to claim 7, further comprising forming an insulator on the sacrificial gates before forming the source/drain structures.

9. The method according to claim 7, wherein the first liner material is formed on the gate conductors.

10. The method according to claim 7, wherein the first ALD and the second ALD deposit the first liner material and the second material over the source/drain contacts, wherein the method further comprises performing a planarization process to remove the first liner material and the second material from the source/drain contacts.

11. The method according to claim 7, wherein the first liner material comprises silicon combined with at least one of nitrogen, oxygen, and carbon; wherein the fill material comprises an insulator comprising a flowable combination of silicon, oxygen, and carbon; and
    wherein the second material comprises a combination of silicon and nitrogen.

12. The method according to claim 7, wherein the removing the fill material from the upper portion of the trenches comprises reactive ion etching (ME).

13. The method according to claim 7, wherein the fill material has a dielectric constant lower than 3.0.

14. A method comprising:
    forming a trench in a material;
    forming a conductor in a lower portion of the trench;
    performing a first atomic layer deposition (ALD) of a first liner material to line a middle portion and an upper portion of the trench, the middle portion is between the lower portion and the upper portion;
    flowing a fill material to fill the middle portion and the upper portion of the trench, wherein the fill material has a dielectric constant lower than 3.0;
    removing the fill material from the upper portion of the trench to leave the fill material in the middle portion of the trench; and
    performing a second ALD of a second material to fill the upper portion of the trench with the second material.

15. The method according to claim 14, wherein the first liner material is formed on the conductor.

16. The method according to claim 14, wherein the first liner material comprises silicon combined with at least one of nitrogen, oxygen, and carbon.

17. The method according to claim 14, wherein the fill material comprises an insulator comprising a flowable combination of silicon, oxygen, and carbon.

18. The method according to claim 14, wherein the second material comprises a combination of silicon and nitrogen.

19. The method according to claim 14, wherein the removing the fill material from the upper portion of the trench comprises reactive ion etching (RIE).

* * * * *